United States Patent [19]

Brunner

[11] Patent Number: 5,703,384

[45] Date of Patent: Dec. 30, 1997

[54] MOS SEMICONDUCTOR COMPONENT HAVING IMPROVED TRANSMISSION PROPERTIES

[75] Inventor: Heinrich Brunner, Munich, Germany

[73] Assignee: Siemens Aktiengesellschaft, Munich, Germany

[21] Appl. No.: 645,505

[22] Filed: May 14, 1996

[30] Foreign Application Priority Data

Jun. 19, 1995 [DE] Germany .................. 194 22 161.3

[51] Int. Cl.⁶ .................. H01L 29/80; H01L 29/76; H01L 29/94; H01L 29/00
[52] U.S. Cl. .................. 257/139; 257/262; 257/263; 257/273; 257/330; 257/331; 257/332; 257/333; 257/342; 257/376; 257/378; 257/517; 257/526
[58] Field of Search .................. 257/273, 378, 257/517, 526, 262, 263, 376, 330, 331, 332, 333, 342

[56] References Cited

U.S. PATENT DOCUMENTS 4,791,462  12/1988  Blanchard et al. .................. 257/331
5,396,087  3/1995  Baliga .................. 257/342

FOREIGN PATENT DOCUMENTS 402240936  9/1990  Japan .................. 257/262
405109980  4/1993  Japan .................. 257/532

OTHER PUBLICATIONS

Jpn. J. Appl. Phys. vol. 33 (1994) Part 1, No. 1B, Jan. 1994, Latch-Up Suppressed Insulated Gate Bipolar Transistor by the Deep P⁺ Ion Implantation under the n⁺ Source, by Byeong-Hoon Lee et al, pp. 563–566.

Solid-State Electronics, vol. 37 No. 3, The Effect of the Hole Current on the Channel Inversion in Trench Insulated Gate Bipolar Transistors (TIGBT), (1994), pp. 507–514.

Primary Examiner—Mahshid D. Saadat
Assistant Examiner—Ida M. Soward
Attorney, Agent, or Firm—Hill, Steadman & Simpson

[57] ABSTRACT

In IGBTs or, respectively, MOSFETs a parasitic junction-FET effect can be nearly avoided on the basis of an insulation layer introduced between the two base zones and into which an electrode is additionally embedded. The on-resistance is lowered as a result thereof. In an advantageous development, a potential activation of the parasitic bipolar structure (latch-up) can also be prevented.

9 Claims, 3 Drawing Sheets

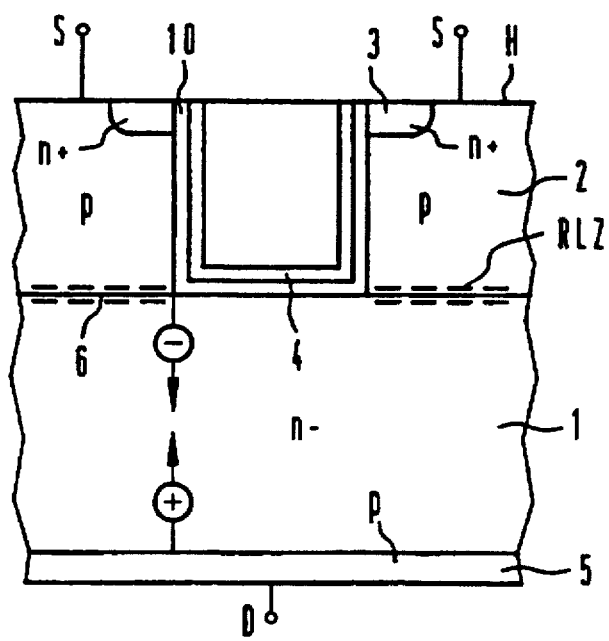
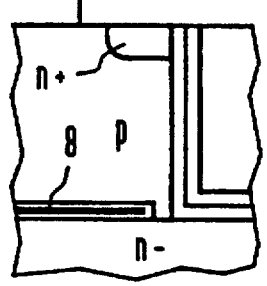
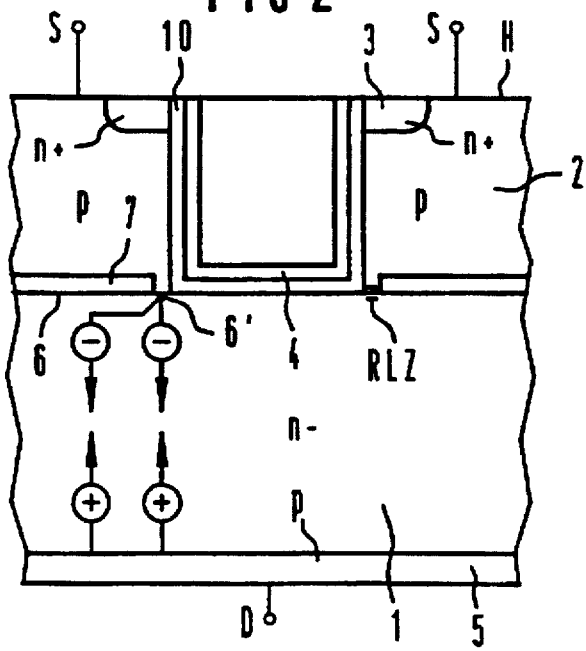
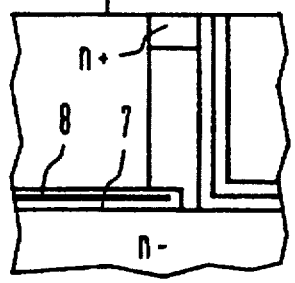
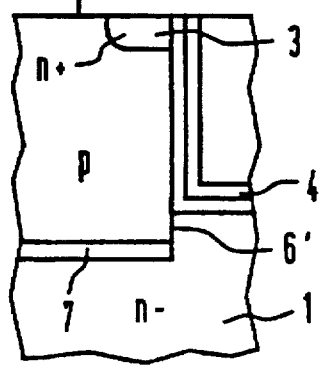

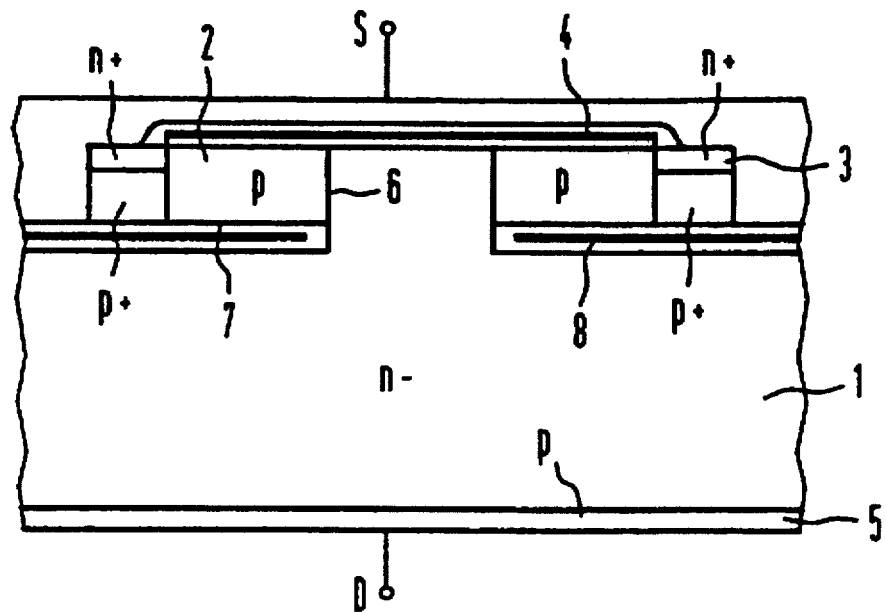
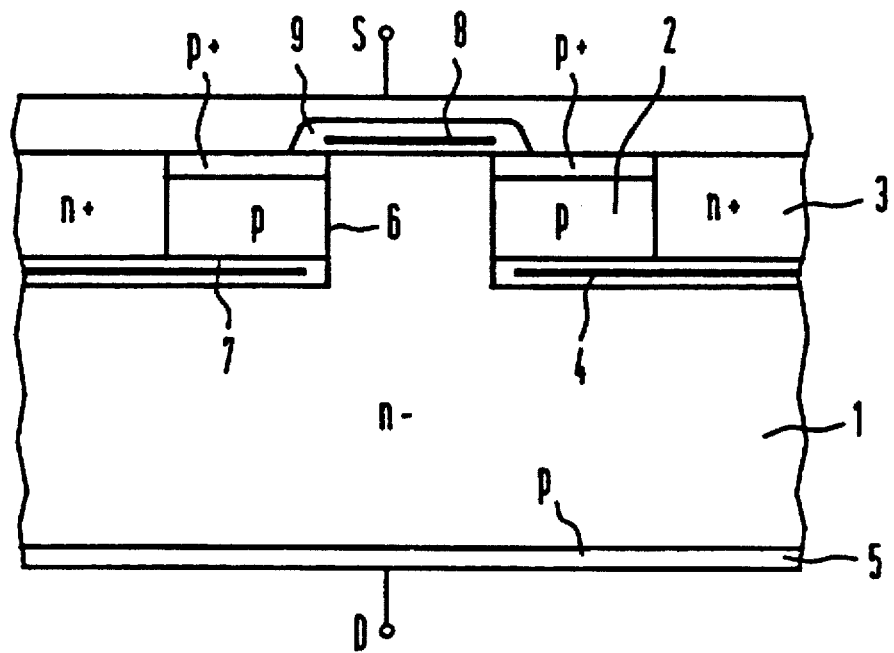

5,703,384

MOS SEMICONDUCTOR COMPONENT HAVING IMPROVED TRANSMISSION PROPERTIES

BACKGROUND OF THE INVENTION

The on-resistance is an important characteristic in regards to transmission losses in planar and non-planar MOS semiconductor structures such as, for example, MOSFETs and IGBTs (Isolated Gate Bipolar Transistor). The entire resistance between the source zone and the drain zone in the transmissive state is referred to as on-resistance of a MOS semiconductor component. The on-resistance is determined by the channel resistance in the MOSFET channel, by a parasitic junction-FET effect of the p-well and by a track resistance of the n-base. The effect of the parasitic junction-FET is explained as follows. The junction from p-base to n-base is polarized in a blocking direction during the transmissive state. A space charge zone forms, as a result whereof the current path of the electrons from source to drain is constricted. An increase in the on-resistance is the result.

SUMMARY OF THE INVENTION

It is an object of the present invention to provide an MOS semiconductor component wherein an increase of the on-resistance due to the parasitic junction-FET is optimally avoided.

In general terms the present invention is an MOS semiconductor having a source zone of a first conductivity type, a base zone of a second conductivity type that are both connected in common to a source terminal and having a common pn-junction. A base zone of the first conductivity type has a pn-junction to the base zone of the second conductivity type. A gate electrode is separated from the base zone of the first conductivity type and from the base zone of the second conductivity type only by an oxide layer. The base zone of the first conductivity type is separated from the base zone of the second conductivity type by an insulating layer such that a junction between the two base zones is present only in the immediate proximity of the gate oxide.

Advantageous developments of the present invention, especially wherein an activation of a parasitic bipolar structure present in the MOS semiconductor structure is advantageously prevented (latch-up) are as follows.

An electrically conductive electrode is introduced into the insulating layer such that the electrode is insulated from all regions of the semiconductor.

The source electrode directly adjoins the oxide layer and the electrode is separated from the source electrode only by the oxide layer.

The junction between the base zone of the first conductivity type and the base zone of the second conductivity type proceeds in vertical direction with reference to a horizontal, principal surface of the MOS semiconductor element.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 depicts a trench IGBT of the prior art;

FIG. 2 depicts a first embodiment of an inventive trench IGBT;

FIG. 3 depicts a second embodiment of an inventive trench IGBT;

FIG. 4 depicts a first advantageous development of a cell structure of the inventive IGBT of FIGS. 2 and 3;

FIG. 5 depicts a second advantageous development of the cell structure of the inventive IGBT of FIGS. 2 and 3;

FIG. 6 depicts a structure of an inventive planar IGBT;

FIG. 7 depicts an advantageous development of the cathode structure of the inventive IGBT of FIG. 6;

DESCRIPTION OF THE PREFERRED EMBODIMENTS

Figure 8:
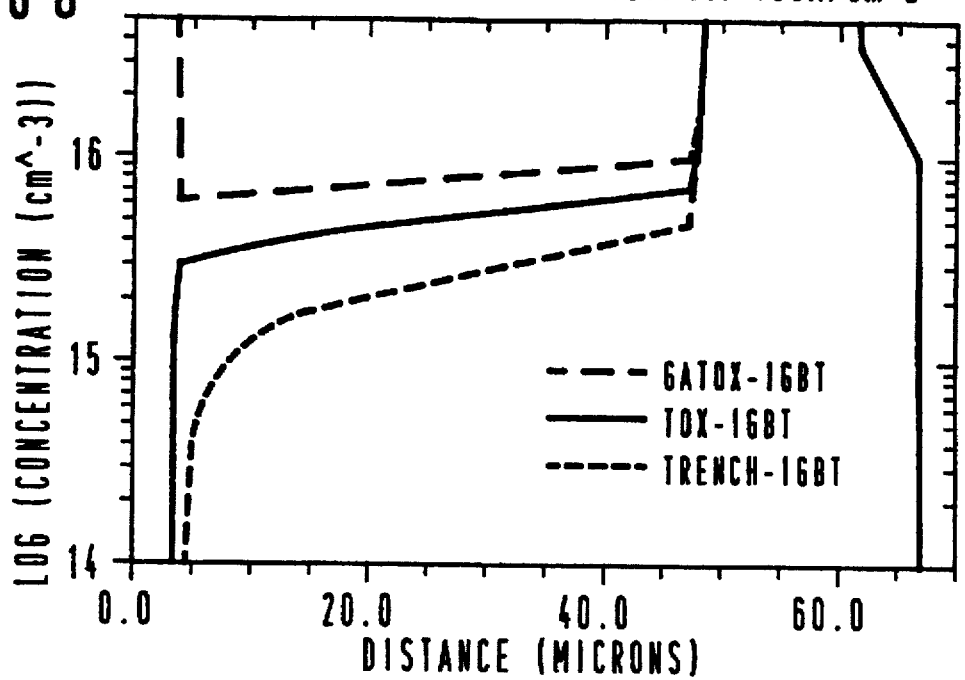
FIG. 8 is a graph of the charge carrier concentration in transmission entered over the vertical locus coordinate in the middle of the p-well for trench IGBTs of FIGS. 1, 2 and 3.

As shown in FIG. 1, a trench IGBT of the prior art has a semiconductor body with a lightly n-doped base zone 1. A p-doped base zone 2 is embedded into the n-base 1. An n-doped source zone 3 is embedded into this p-base. A gate electrode 4 is electrically separated from the p-base 2, the n-base 1 and the n-source zone 3 by an insulating layer 10.

When a positive voltage is applied to the gate electrode 4, an n-conductive channel (inversion layer) that electrically conductively connects the n-source zone to the n-base zone arises in the p-base 2. The n-source electrode and the p-base zone are contacted via a source terminal S. A more highly doped p-zone 5 that is electrically connected to the drain terminal D adjoins the n-base zone at the drain side.

When a positive voltage is applied to the terminal D, then, given a positive gate voltage, electrons flow from the source zone 3 via the n-base 1 to the p-zone 5. The p-emitter 5 of the drain side is driven by the electrons and holes are injected into the n-base 1, these flowing off via the p-base 2 to the source terminal S. As a result of the hole injection, the n-base 1 is flooded with charge carriers; a conductivity modulation of the n-base resistance thereby arises. In the on-state, the potential of the drain side is higher than that of the source side at the pn-junction 6 The pn-junction 6 is therefore polarized in the blocking direction. Due to the creation of a space charge zone RLZ, a lowering of the concentration of the free charge carriers arises thereat in the on state. The conductivity modulation in the n-base 1 is thereby reduced, which leads to an increase in the on-resistance. The IGBT in FIG 1 has a parasitic thyristor structure that is formed of the n-source zone 3 of the p-base 2 and of the n-base 1 and the p-emitter 5. When the hole current flowing in the transverse direction under the n-source zone 3 at the junction between n-source zone 3 and p-base 2 generates a voltage drop that is greater than the threshold voltage, then electrons from the n-source zone 3 are injected into the p-base 2. The parasitic thyristor is activated in this condition and the component can no longer be controlled by the voltage at the gate electrode 4.

An inventive IGBT of FIG. 2 has an insulating layer 7 between the p-base and the n-base, so that the p-base 2 and the n-base 1 are electrically connected only via a narrow region 6', the region 6' advantageously having a width between 100 and 1000 nm. The lateral formation of the space charge zone RLZ is limited to the narrow region 6'. The cathode-side lowering of the charge carrier concentration at the boundary layer 6 between the insulating layer 7 and the n-base 1 is cancelled.

When the insulating layer 7 is composed of an oxide layer, then this can be produced, for example, given implantation.

FIG. 3 in particular, shows an insulating layer 7 into which an additional electrode 8 is embedded, whereby the insulating layer is advantageously between 400 and 900 nm thick and the electrode is advantageously between 200 and 500 thick. The insulating layer 7 is composed, for example, of $SiO_2$ and the electrode 8 can be produced, for example, of polysilicon. The electrode 8 can thereby be optionally electrically connected to the electrode 4.

In the on state, an accumulation layer that leads to a boost of the charge carrier concentration in the n-base 1 forms at the boundary layer 6 given a positive polarization of the electrode 8.

FIG. 4 shows an advantageous development of the present invention, wherein the source terminal S extends to the insulating layer 7. The hole current is thereby extracted from the source contact S above the insulating layer and, consequently, does not flow off next to the n-source zone 3. An injection of electrons of the n-source zone 3 is thus suppressed. An activation of the parasitic thyristor (latch-up) that is composed of the four-layer structure n-source zone 3, p-base 2, n-base 1 and p-emitter 5 is thereby avoided.

The source electrode S can optionally laterally terminate with the edge of the insulating layer 7.

In FIG. 2, the space charge zone is terminated both by the p-zone 2 and by the insulating zone 7. Field peaks at the junction of the p-base 2 to the insulating layer 7 can reduce the breakdown voltage.

FIG. 5 shows an advantageous development of the present invention wherein the pn-junction of the region 6' proceeds vertically and the insulating layer 7 as well as the gate electrode 4 horizontally overlap, whereby the region 6 advantageously has a width between 400 and 900 nm. In the non-conducting state, the space charge zone is stopped by the insulating layer and not be the region 6', as a result whereof the risk of field peaks is reduced. When the insulating layer 7 is produced as silicon oxide, then it has an approximately 100-fold higher breakdown field strength than silicon and therefore advantageously influences the blocking voltage of the inventive MOS semiconductor component.

The inventive MOS semiconductor component is implemented in planar structure in FIG. 6. The insulating layer 7 prevents a vertical spread of the space charge zone between the p-zone 2 and the n-zone 1 in the on state, as a result whereof an improvement of the on-resistance is effected. The embedding of the electrode 8 that generates an accumulation layer given positive polarization is provided in the insulating layer for further reduction of the on-resistance.

FIG. 7 shows an inventive, planar IGBT whose gate electrode 4 is embedded in the insulating layer 7. The inversion channel lies between p-layer 2 and insulating layer 7. The minority charge carriers coming from the n-base 1 flow off directly from the source terminal S via the p-base. Therefore, an activation of the parasitic bipolar transistor can not occur. The electrode 8 is embedded in the insulating layer 9. The electrode 8 is positively polarized in the on state. The accumulation layer at the junction of insulating layer 9 to n-base 1 leads to a boost of the charge carrier concentration in the n-base 1 and, thus, to an improvement of the on-resistance.

FIG. 8 shows charge carrier distributions for the known IGBT of FIG. 1 and for the two inventive IGBTs of FIGS. 2 and 3 given an on-state current of 100 A/cm$^2$.

The effect of the insulating layer 7 is that a space charge zone RLZ does not arise at the junction 6 between the insulating layer and the n-base, and the charge carrier concentration of the free charge carriers thereat is not reduced in the n-base 1.

The positive polarization of the electrode 8 generates an accumulation layer and additionally raises the charge carrier concentration in the n-base 1.

Figure 9:
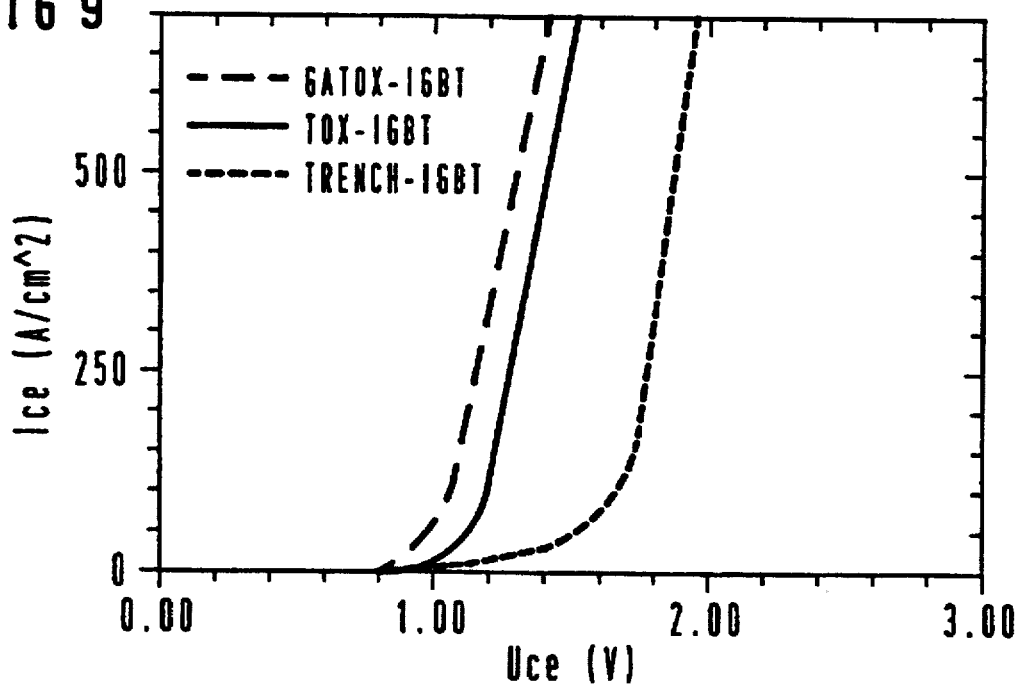
FIG. 9 is a graph of the on-state current dependent on the on-state voltage for a trench IGBT of FIGS. 1,2 and 3.

FIG. 9 shows the on-state characteristics of the drain-source current $I_{ce}$. In a comparison to the known IGBT, the technical advantage is in a lower voltage drop, and, given a drain-source current density of about 100 A/cm$^2$, is a reduction of the voltage drop by 0.5 Volts for the embodiment of the inventive IGBT shown in FIG. 2 and is a voltage drop lower by 0.65 Volts than the known IGBT given the exemplary embodiment of the inventive IGBT of FIG. 3.

In addition to the IGBTs described above by way of example, the described principle can also be applied to U-MOS and V-MOS field effect transistors. Compared to the IGBT, it is essentially only the drain-side p-emitter region 5 that is lacking, and the drain terminal D is directly connected to the n-base 1.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An MOS semiconductor component, comprising:
  a source zone of a first conductivity type, a base zone of a second conductivity type that are both connected in common to a source terminal, the source zone and the base zone having a common pn-junction;
  a base zone of the first conductivity type that has a pn-junction with the base zone of the second conductivity type; and
  a gate electrode that is separated from the base zone of the first conductivity type and from the base zone of the second conductivity type only by an oxide layer, the base zone of the first conductivity type being separated from the base zone of the second conductivity type by an insulating layer such that a junction between the base zones of the first and second conductivity types is present only in an immediate proximity of the oxide layer.

2. The MOS semiconductor component according to claim 1, wherein an electrically conductive electrode is introduced into the insulating layer such that the electrically conductive electrode is insulated from all regions of the semiconductor.

3. The MOS semiconductor component according to claim 2, wherein a source electrode directly adjoins the oxide layer and the electrically conductive electrode is separated from the source electrode only by the oxide layer.

4. The MOS semiconductor component according to claim 1, wherein the junction between the base zone of the first conductivity type and the base zone of the second conductivity type proceeds in vertical direction with reference to a horizontal, principal surface of the MOS semiconductor component.

5. An MOS semiconductor component, comprising:
  a source zone of a first conductivity type, a base zone of a second conductivity type that are both connected in common to a source terminal, the source zone and the base zone having a common pn-junction;

a base zone of the first conductivity type that has a pn-junction with the base zone of the second conductivity type;

a gate electrode that is separated from the base zone of the first conductivity type and from the base zone of the second conductivity type only by an oxide layer, the base zone of the first conductivity type being separated from the base zone of the second conductivity type by an insulating layer such that a junction between the base zones of the first and second conductivity types is present only in an immediate proximity of the oxide layer;

an electrically conductive electrode in the insulating layer, the electrically conductive electrode being insulated from the source zone and the base zones.

6. The MOS semiconductor component according to claim 5, wherein a source electrode directly adjoins the oxide layer and the electrically conductive electrode is separated from the source electrode only by the oxide layer.

7. The MOS semiconductor component according to claim 5, wherein the junction between the base zone of the first conductivity type and the base zone of the second conductivity type proceeds in vertical direction with reference to a horizontal, principal surface of the MOS semiconductor component.

8. An MOS semiconductor component, comprising:

a source zone of a first conductivity type, a base zone of a second conductivity type that are both connected in common to a source terminal, the source zone and the base zone having a common pn-junction;

a base zone of the first conductivity type that has a pn-junction with the base zone of the second conductivity type;

a gate electrode that is separated from the base zone of the first conductivity type and from the base zone of the second conductivity type only by an oxide layer, the base zone of the first conductivity type being separated from the base zone of the second conductivity type by an insulating layer such that a junction between the base zones of the first and second conductivity types is present only in an immediate proximity of the oxide layer;

an electrically conductive electrode in the insulating layer, the electrically conductive electrode being insulated from the source zone and the base zones; and a source electrode directly adjoining the oxide layer and the electrically conductive electrode being separated from the source electrode only by the oxide layer.

9. The MOS semiconductor component according to claim 8, wherein the junction between the base zone of the first conductivity type and the base zone of the second conductivity type proceeds in vertical direction with reference to a horizontal, principal surface of the MOS semiconductor component.

* * * * *